(12) United States Patent
Yeh et al.

(10) Patent No.: US 9,104,401 B2
(45) Date of Patent: Aug. 11, 2015

(54) FLASH MEMORY APPARATUS WITH SERIAL INTERFACE AND RESET METHOD THEREOF

(71) Applicant: Winbond Electronics Corp., Taichung (TW)

(72) Inventors: Jun-Lin Yeh, Hsinchu County (TW); Chi-Cheng Lin, Miaoli County (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/529,167

(22) Filed: Oct. 31, 2014

(65) Prior Publication Data

US 2015/0058544 A1 Feb. 26, 2015

Related U.S. Application Data

(62) Division of application No. 13/034,683, filed on Feb. 24, 2011, now Pat. No. 8,914,569.

(51) Int. Cl.
*G06F 12/00* (2006.01)
*G06F 9/30* (2006.01)
*G06F 12/02* (2006.01)
*G11C 16/20* (2006.01)
*G11C 16/22* (2006.01)

(52) U.S. Cl.
CPC ............ *G06F 9/30043* (2013.01); *G06F 12/00* (2013.01); *G06F 12/0246* (2013.01); *G11C 16/20* (2013.01); *G11C 16/22* (2013.01); *G06F 2212/7206* (2013.01); *G11C 2216/30* (2013.01)

(58) Field of Classification Search
None
See application file for complete search history.

(56) References Cited

U.S. PATENT DOCUMENTS

| | | | | |
|---|---|---|---|---|
| 2003/0043751 A1* | 3/2003 | Nelson | ............ | 370/244 |
| 2007/0189096 A1* | 8/2007 | Lee | ............ | 365/222 |
| 2008/0136457 A1* | 6/2008 | Wagensohner et al. | ......... | 327/35 |

* cited by examiner

*Primary Examiner* — Baboucarr Faal
(74) *Attorney, Agent, or Firm* — Jianq Chyun IP Office

(57) ABSTRACT

A flash memory apparatus with serial interface is disclosed. The flash memory apparatus includes a command receiver, a command decoder and a core circuit. The command receiver sequentially receives a plurality of command data through the data input pin and the clock pin. The command decoder receives a command sequence formed by the command data, and compares the command sequence with a reference sequence to generate a reset signal. The core circuit receives the reset signal to activate a reset operation according to the reset signal.

3 Claims, 6 Drawing Sheets

FLASH MEMORY APPARATUS WITH SERIAL INTERFACE AND RESET METHOD THEREOF

CROSS-REFERENCE TO RELATED APPLICATION

This application is a divisional of and claims the priority benefit of U.S. non-provisional application Ser. No. 13/034,683, filed on Feb. 24, 2011, now allowed. The entirety of the above-mentioned patent application is hereby incorporated by reference herein and made a part of this specification.

BACKGROUND

1. Field of the Invention

The invention relates to a flash memory apparatus with a serial interface. Particularly, the invention relates to a device for resetting a flash memory chip with a serial interface and a method thereof.

2. Description of Related Art

In order to improve competitiveness of electronic products, parallel flash memory chips built in electronic products are gradually replaced by low-cost serial flash memory chips. In order to reduce the cost, the serial flash memory chip is generally packaged in a low number of pins. Therefore, the serial flash memory chip generally provides 8 pins of a chip select (/CS) pin, a serial data input (SI) pin, a serial data output (SDO) pin, a clock (CLK) pin, a write protect (/WP) pin, a hold (/HOLD) pin, a power (VDD) pin and a ground (GND) pin ("/" represents low level enable).

Namely, the serial flash memory chip generally does not provide a reset pin to allow a user to reset the flash memory chip from external. When the user wants to reset the flash memory chip, the user has to reset the power of the flash memory chip, so as to enable an operation of a power-on reset circuit built in the flash memory chip for resetting the flash memory chip. However, the power-on reset operation may probably reset the power of other circuits (for example, a controller) sharing the same power source with the flash memory chip. Therefore, the whole system that the flash memory chip is became too hard to be controlled, and initialization has to be re-performed, which may cause a great trouble.

SUMMARY OF THE INVENTION

The invention is directed to a flash memory apparatus with a serial interface and a method for activating a reset operation of the flash memory apparatus, by which a write protect pin or a hold pin can also be used to transmit a reset signal to reset the flash memory apparatus.

The invention is directed to a flash memory apparatus with a serial interface and a method for activating a reset operation of the flash memory apparatus, in which a clock pin and a data input pin are used to implement a reset operation of the flash memory apparatus.

The invention provides a flash memory apparatus with a serial interface. The flash memory apparatus includes a selector, a core circuit and a programmable data bank. The selector is coupled to one of a write protect pin or a hold pin of the flash memory apparatus, and decides whether or not to connect the write protect pin or the hold pin to a reset signal line according to a selecting signal. The core circuit is coupled to the reset signal line, and receives a reset signal transmitted by the reset signal line to perform a reset operation. The programmable data bank is coupled to the selector, and a selecting data is written into the programmable data bank through a programming method, and the programmable data bank outputs the selecting data to serve as the selecting signal.

The invention provides a flash memory apparatus with a serial interface. The flash memory apparatus includes a command receiver, a command decoder and a core circuit. The command receiver is coupled to a clock pin and a data input pin of the flash memory apparatus, and sequentially receives a plurality of command data through the data input pin and the clock pin. The command decoder is coupled to the command receiver, and receives a command sequence formed by the command data. The command decoder compares the command sequence with a reference sequence to generate a reset signal. The core circuit is coupled to the command decoder, and receives the reset signal to perform a reset operation according to the reset signal.

The invention provides a method for activating a reset operation of a flash memory apparatus, which can be described as follows. First, a programmable data bank receives a selecting data, and it is decided whether or not to connect a write protect pin or a hold pin of the flash memory apparatus to a reset signal line according to the selecting data.

The invention provides a method for activating a reset operation of a flash memory apparatus, which can be described as follows. A clock pin and a data input pin of the flash memory apparatus sequentially receives a plurality of command data, and then a reset signal is generated by comparing a reference sequence with a command sequence formed by the command data. The reset signal is used for resetting a core circuit of the flash memory apparatus.

According to the above descriptions, in the invention, when the write protect pin or the hold pin of the flash memory apparatus with the serial interface is not required to execute its original function, one of the write protect pin or the hold pin is switched to a pin capable of activating a reset function, so that the flash memory apparatus with the serial interface can activate the reset operation without adding an extra pin. Moreover, the clock pin and the data input pin of the flash memory apparatus with the serial interface are used to transmit a specified command sequence, and the flash memory apparatus can automatically generate the reset signal to perform the reset operation according to the specified command sequence, by which the reset operation can also be accomplished without adding an extra pin.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
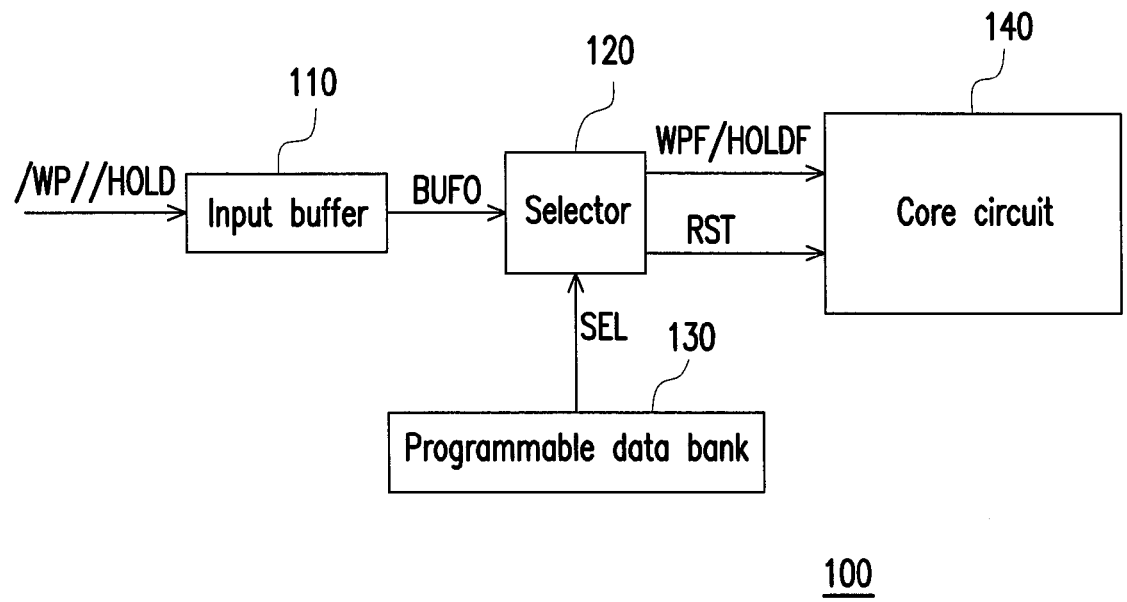
FIG. 1 is a schematic diagram of a flash memory apparatus 100 according to an embodiment of the invention.
Figure 4:
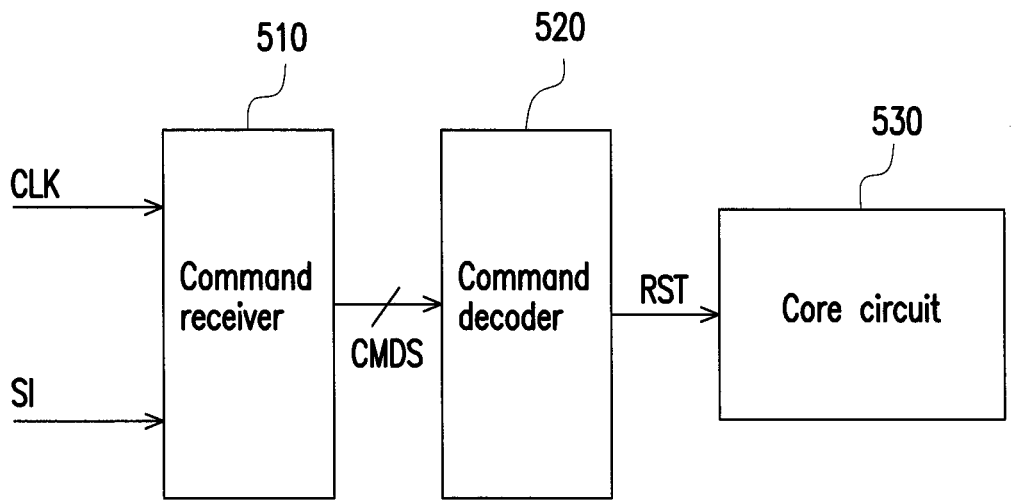
FIG. 4 is a schematic diagram illustrating a flash memory apparatus 500 according to another embodiment of the invention.
Figure 5:
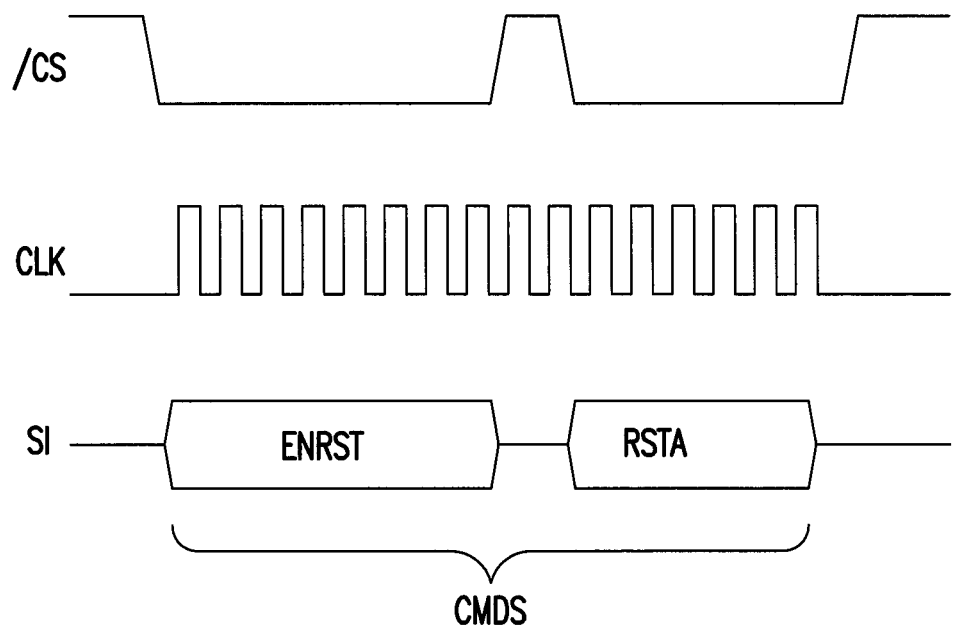
FIG. 5 is an operation waveform diagram of the flash memory apparatus 500 of FIG. 4.
Figure 6:
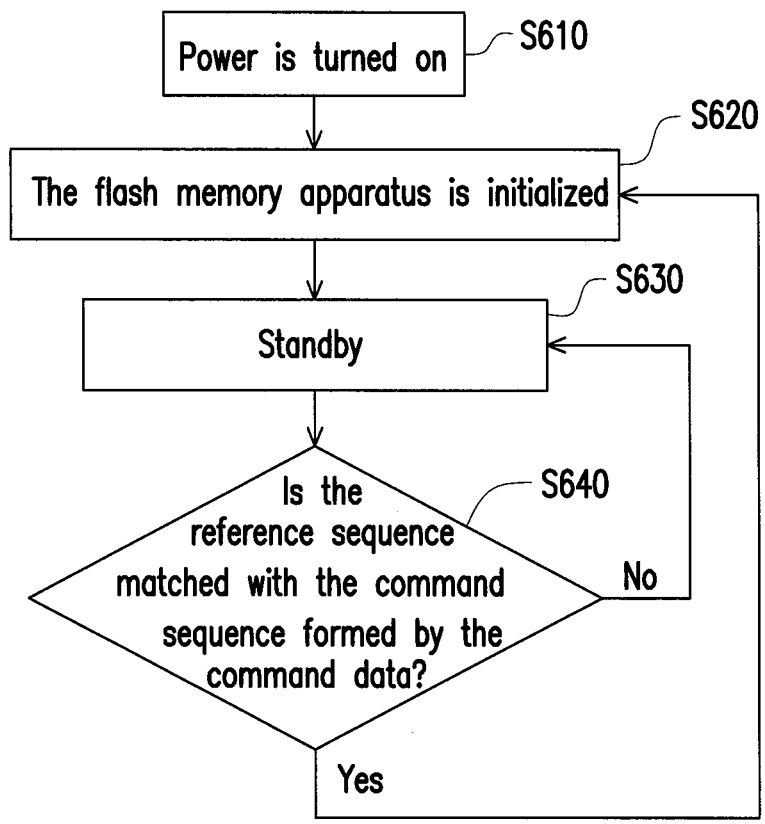
FIG. 6 is a flowchart illustrating an operation flow according to another embodiment of the invention.

Three embodiments are provided to describe features of the invention. In one embodiment, a function of a pin is permanently converted to implement a reset operation (FIGS. 1-2B). In another embodiment, a function of a pin is temperately converted (FIGS. 3A-3C) to implement the reset operation when necessary. In the last embodiment, command data are used to implement the reset operation of a flash memory apparatus (FIGS. 4-6).

Referring to FIG. 1, FIG. 1 is a schematic diagram of a flash memory apparatus 100 according to an embodiment of the invention. The flash memory apparatus 100 is a memory device capable of being accessed through a serial interface, for example, through a serial peripheral interface (SPI). In the present embodiment, the flash memory apparatus 100 includes an input buffer 110, a selector 120, a programmable data bank 130 and a core circuit 140.

The input buffer 110 is coupled to the selector 120 and is directly connected to one of a write protect pin /WP and a hold pin /HOLD. The input buffer 110 provides an output signal line BUFO to transmit a signal transmitted by the write protect pin /WP or the hold pin /HOLD. The output signal line BUFO is connected to the selector 120.

The selector 120 is coupled to the output signal line BUFO, so as to connect one of the write protect pin /WP and the hold pin /HOLD through the input buffer 110. The selector 120 decides whether or not to connect the write protect pin /WP or the hold pin /HOLD to a reset signal line RST according to a selecting signal SEL. For example, when the selecting signal SEL has a logic high level "H," the selector 120 connects the output signal line BUFO to the reset signal line RST, and when the selecting signal SEL has a logic low level "L," the selector 120 connects the output signal line BUFO to one of a write protect signal line WPF and a hold signal line HOLDF.

In detail, if a signal transmitted by the output signal line BUFO of the input buffer 110 is a buffered signal come from the write protect pin /WP, when the selecting signal SEL has the logic high level "H," the write protect pin /WP is coupled to the reset signal line RST. Now, the write protect pin /WP can be used to transmit a reset signal, and the reset signal can be successfully transmitted to the reset signal line RST. Conversely, when the selecting signal SEL has the logic low level "L," the write protect pin /WP is coupled to the write protect signal line WPF. Now, a user can perform a write protect operation through the write protect pin /WP, i.e., an original function of the write protect pin /WP is executed.

Similarly, if a signal transmitted by the output signal line BUFO of the input buffer 110 is a buffered signal come from the hold pin /HOLD, when the selecting signal SEL has the logic high level "H," the hold pin /HOLD is coupled to the reset signal line RST. Now, the hold pin /HOLD can be used to transmit the reset signal, and the reset signal can be successfully transmitted to the reset signal line RST. Conversely, when the selecting signal SEL has the logic low level "L," the hold pin /HOLD is coupled to the hold signal line HOLDF.

Now, the user can perform a hold operation through the hold pin /HOLD, i.e., an original function of the hold pin /HOLD is executed.

It should be noticed that a relationship between the high and low logic levels of the selecting signal SEL and selecting states of the selector 120 is not limited to the above description. The relationship between the high and low logic levels of the selecting signal SEL and the selecting states of the selector 120 can be determined by a designer according to an actual design requirement.

The core circuit 140 is coupled to the reset signal line RST. The core circuit 140 can be reset in response to the reset signal transmitted by the reset signal line RST. On the other hand, the core circuit 140 is also coupled to the hold signal line HOLDF and the write protect signal line WPF. The hold signal line HOLDF is coupled to a circuit related to the hold operation in the core circuit 140, and the write protect signal line WPF is coupled to a circuit related to the write protect operation in the core circuit 140. The reset signal line RST is coupled to a circuit related to the reset operation in the core circuit 140.

Moreover, in case that a power-on reset circuit (not shown) is built in the flash memory apparatus 100, a reset signal provided by the power-on reset circuit is also coupled to the reset signal line RST. In other words, a reset mechanism of the flash memory apparatus 100 provided through the write protect pin /WP or the hold pin /HOLD does not influence an original reset mechanism of the flash memory apparatus 100.

The programmable data bank 130 is coupled to the selector 120 for providing the selecting signal SEL. A selecting data is written into the programmable data bank 130 by the user through a programming method. The programmable data bank 130 may output the selecting data written by the user to serve as the selecting signal.

Figure 2A:
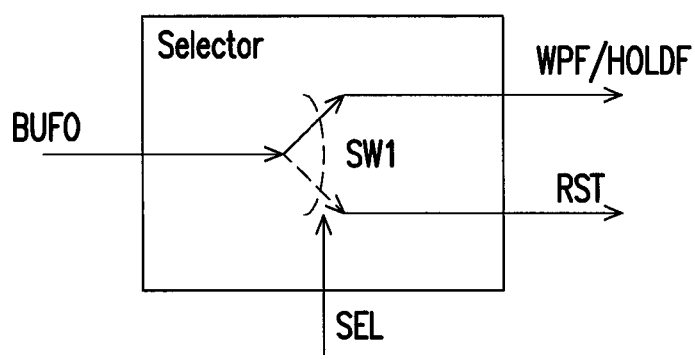
FIG. 2A is a diagram illustrating an implementation of a selector 120 of FIG. 1.
Figure 2B:
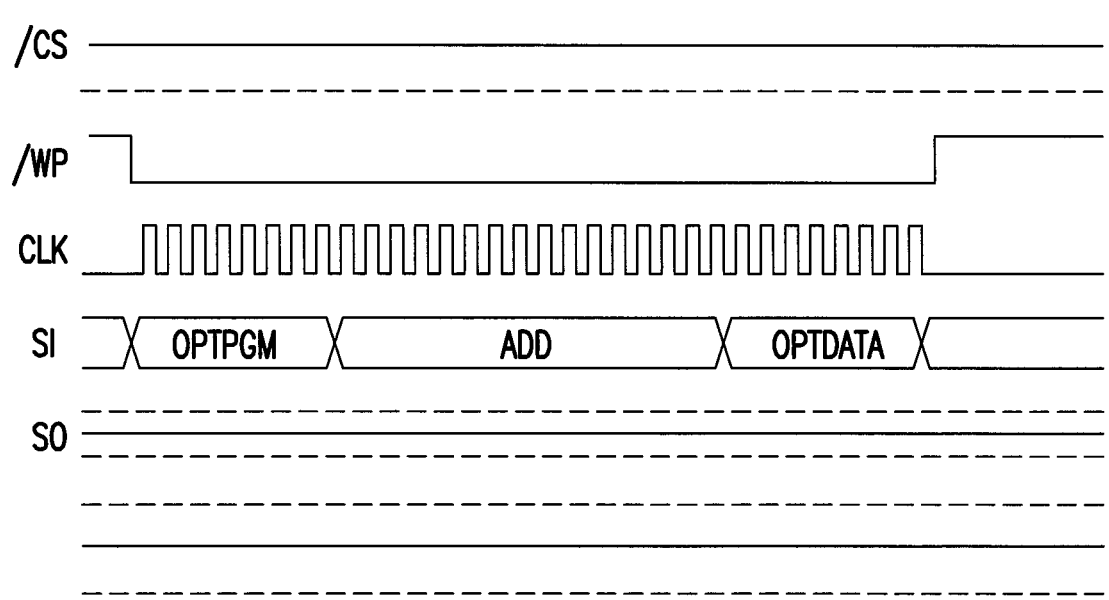
FIG. 2B is a waveform diagram of a programming method of a non-volatile flash memory.

Referring to FIG. 2A, FIG. 2A is a diagram illustrating an implementation of the selector 120 of FIG. 1. In the present embodiment, the selector 120 includes a switch SW1. One end of the switch SW1 is coupled to the output signal line BUFO of the input buffer 110, and another end of the switch SW1 is coupled to the reset signal line RST or one of the write protect signal line WPF and the hold signal line HOLDF according to the selecting signal SEL.

Certainly, the selector 120 is unnecessarily to be implemented by the switch SW1 of the present embodiment. The selector 120 can also be implemented by a transmission gate in a logic circuit or other types of logic gates. A method of implementing the selector 120 through the logic circuit is familiar by those skilled in the art, which is not described herein.

Moreover, the programmable data bank 130 can be implemented by a non-volatile memory, i.e., a small block is defined in the flash memory apparatus 100 to store the selecting data. In this case, the user can write the selecting data into memory cells of the flash memory through a programming method. Referring to FIG. 2B for the programming method of the selecting data, and FIG. 2B is a waveform diagram of a programming method of a non-volatile flash memory. In brief, in collaboration with signals of a data input pin SI and a clock pin CLK, a command data OPTPGM is first written to activate a writing mode of the non-volatile memory, and then a command data ADD is written for addressing the non-volatile memory, and finally a command data OPTDATA (i.e., the selecting data) is written, so as to write the selecting data into the non-volatile memory.

Figure 3A:
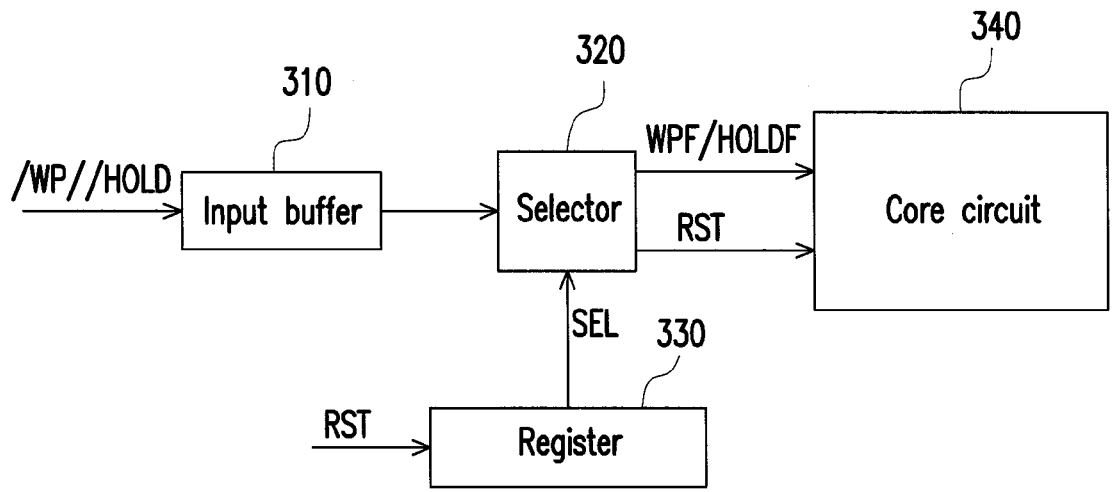
FIG. 3A is a schematic diagram illustrating a flash memory apparatus 300 according to another embodiment of the invention.

Referring to FIG. 3A, FIG. 3A is a schematic diagram illustrating a flash memory apparatus 300 according to another embodiment of the invention. The flash memory apparatus 300 includes an input buffer 310, a selector 320, a core circuit 340 and a programmable data bank implemented by a register 330. The register 330 can be written with the selecting data, and can output the stored selecting data to serve as the selecting signal SEL.

Figure 3B:
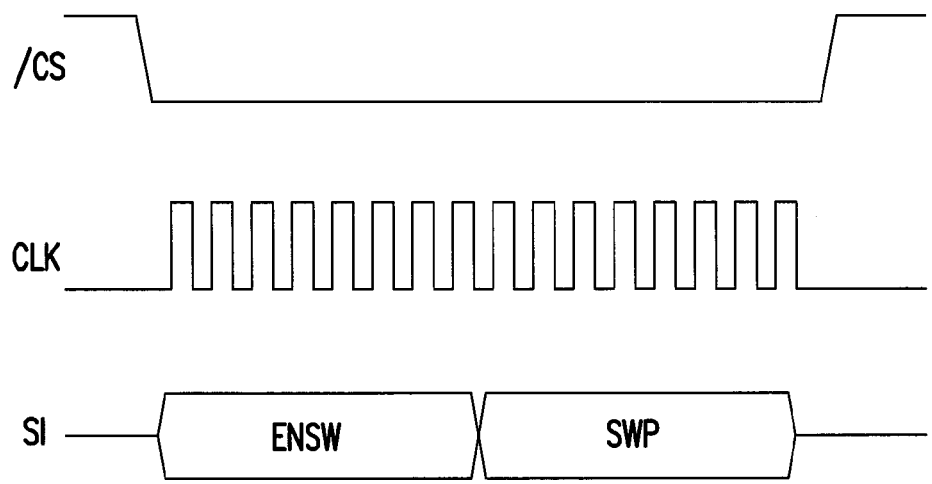
FIG. 3B is an operation waveform diagram of flash memory apparatus 300 of FIG. 3A.

Referring to FIG. 3A and FIG. 3B, FIG. 3B is an operation waveform diagram of the flash memory apparatus 300 of FIG. 3A. When a signal on a chip select pin /CS is pulled to the logic low level "L," the signal on the data input pin SI can be sampled according to the signal of the clock pin CLK to generate command data ENSW and SWP. The command data ENSW represents that one of the write protect pin /WP and the hold pin /HOLD of the flash memory apparatus 300 is ready for being switched to a pin capable of activating the reset operation. The command data SWP following the command data ENSW represents writing the selecting data into the register 330, where the selecting data indicates switching one of the write protect pin /WP and the hold pin /HOLD to the pin capable of activating the reset operation. After the selecting data is written into the register 330, the register 330 outputs the selecting signal SEL to switch one of the write protect pin /WP and the hold pin /HOLD to the pin capable of activating the reset operation.

Since the register 330 is also coupled to the reset signal line RST, when the pin (one of the write protect pin /WP and the hold pin /HOLD) capable of activating the reset operation is switched, and one of the write protect pin /WP and the hold pin /HOLD is used to activate the reset operation, the register 330 is also reset. Namely, in the present embodiment a function switch operation of the write protect pin /WP or the hold pin /HOLD is temporary, and after the reset operation is executed, the function switch operation of the write protect pin /WP or the hold pin /HOLD is disappeared. It should be noticed that in order to avoid a miss operation of the flash memory apparatus 300 due to noise interference, a plurality of command data can be used to implement the above function switch operation (i.e., a switch operation of switching one of the write protect pin /WP and the hold pin /HOLD to the pin capable of activating the reset operation). Certainly, in case of an ideal working environment (low noise interference), a single command data can be used to implement the above function switch operation. Moreover, when a plurality of the command data is used to implement the above function switch operation, a sequence of the command data has to be correct. Taking the waveform of FIG. 3B as an example, the command data ENSW and the command data SWP has to be sequentially input in connection, so as to effectively activate the function switch operation. Namely, if another command data other than the command data SWP is inserted behind the command data ENSW, the function switch operation is not executed.

Figure 3C:
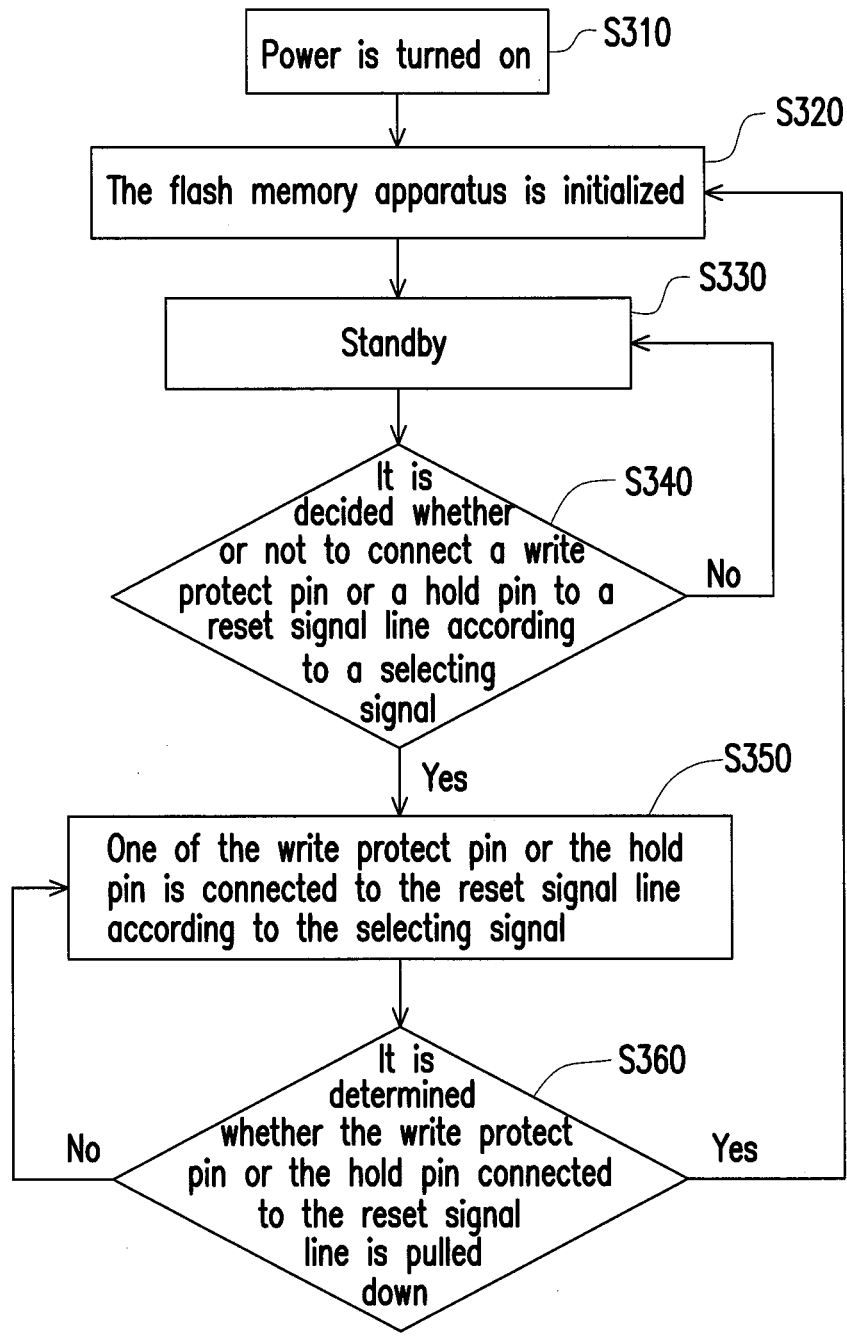
FIG. 3C is a flowchart illustrating an operation flow according to an embodiment of the invention.

FIG. 3C is a flowchart illustrating an operation flow according to an embodiment of the invention. The operation flow includes following steps. First, a power of a flash memory apparatus is turned on (S310). Then, the flash memory apparatus is initialized (S320). After the initialization, the flash memory apparatus is standby to provide a normal function of the flash memory (for example, accessing operations of read or write) (S330). Now, the flash memory apparatus decides whether or not to connect a write protect pin or a hold pin to a reset signal line according to a selecting signal (S340), and if it is decided that none of the write protect pin or the hold pin is connected to the reset signal line according to the selecting signal, the operation flow returns to the step S330.

Conversely, if one of the write protect pin and the hold pin is connected to the reset signal line according to the selecting signal (S350), it is determined whether the write protect pin or the hold pin connected to the reset signal line is pulled down (a signal thereon is pulled to the logic low level) (S360). If the write protect pin or the hold pin connected to the reset signal line is pulled down, the flash memory apparatus is re-initialized (step S330).

Referring to FIG. 4, FIG. 4 is a schematic diagram illustrating a flash memory apparatus 500 according to another embodiment of the invention. The flash memory apparatus 500 is also a flash memory apparatus with a serial interface. The flash memory apparatus 500 includes a command receiver 510, a command decoder 520 and a core circuit 530. The command receiver 510 is coupled to a clock pin CLK and a data input pin SI of the flash memory apparatus 500. The command receiver 510 sequentially receives a plurality of command data through the clock pin CLK and the data input pin SI. The command decoder 510 is coupled to the command receiver 520, and receives a command sequence CMDS formed by the command data. The command decoder 520 compares the command sequence CMDS with a reference sequence to generate a reset signal RST. The core circuit 530 is coupled to the command decoder 520. The core circuit 530 receives the reset signal RST and performs a reset operation according to the reset signal RST.

In order to clearly describe an operation method of the present embodiment, FIG. 5 is provided for reference. FIG. 5 is an operation waveform diagram of the flash memory apparatus 500 of FIG. 4. When a signal on a chip select pin /CS is pulled to the logic low level "L," the signal on the data input pin SI can be sampled according to the signal of the clock pin CLK to obtain command data ENRST and RSTA. The command data ENRST and RSTA are combined to form the command sequence CMDS. The command data ENRST represents that the reset operation of the flash memory apparatus 500 is ready to be activated. The command data RSTA represents activating the reset operation of the flash memory apparatus 500.

It should be noticed that an occurrence sequence of all of the command data in the command sequence CMDS has to be fixed, so as to effectively active and activate the reset operation of the flash memory apparatus 500. A correct sequence of the command data of the command sequence CMDS is recorded in a reference sequence. After the command decoder 520 receives the command sequence CMDS, the command decoder 520 can compare the command sequence CMDS with the reference sequence, so as to determine whether or not to generate the effective reset signal RST.

Certainly, a number of batches of the command data in the command sequence CMDS is not limited to be two as that illustrated in FIG. 5, and the number of batches of the command data in the command sequence CMDS can be set to be more than two by the designer.

Referring to FIG. 6, FIG. 6 is a flowchart illustrating an operation flow according to another embodiment of the invention, which includes following steps. First, a power of a flash memory apparatus is turned on (S610). Then, the flash memory apparatus is initialized (S620). After the initialization, the flash memory apparatus is standby to provide a normal function of the flash memory (for example, accessing operations of read or write) (S630). Now, the flash memory apparatus receives a plurality of command data from external, and compares a command sequence formed by the command data with a predetermined reference sequence (S640), and if the command sequence is completely matched with the reference sequence, the step S620 is executed, i.e., the flash memory apparatus is reset. If the command sequence is not matched with the reference sequence, the flash memory apparatus continually executes the step S630.

In summary, in the invention, by using the programmable data bank or writing the command data, the flash memory apparatus can activate the reset operation without restarting a power. In this way, limited pins of the existing flash memory apparatus with the serial interface can be effectively used to achieve the reset operation of the flash memory apparatus.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A flash memory apparatus with a serial interface, comprising:
    a command receiver, coupled to a clock pin and a data input pin of the flash memory apparatus, and sequentially receiving a plurality of command data through the data input pin and the clock pin;
    a command decoder, coupled to the command receiver, receiving a command sequence which comprises a first command data and a second command data, and comparing the command sequence with a reference sequence to generate a reset signal; and
    a core circuit, coupled to the command decoder, for receiving the reset signal to activate a reset operation according to the reset signal,
    wherein the first command data represents that the reset operation of the flash memory apparatus is ready to be activated, the second command data represents activating the reset operation of the flash memory apparatus, and an occurrence sequence of all of the command data in the command sequence is fixed.

2. The flash memory apparatus as claimed in claim 1, wherein the serial interface is a serial peripheral interface (SPI).

3. A method for activating a reset operation of a flash memory apparatus with a serial interface, comprising:
    sequentially receiving a plurality of command data through a clock pin and a data input pin of the flash memory apparatus; and
    comparing a reference sequence with a command sequence formed by the command data to generate a reset signal, wherein the reset signal is used for resetting a core circuit of the flash memory apparatus, and the command sequence comprises a first command data and a second command data,
    wherein the first command data represents that the reset operation of the flash memory apparatus is ready to be activated, the second command data represents activating the reset operation of the flash memory apparatus, and an occurrence sequence of all of the command data in the command sequence is fixed.

* * * * *